US005636231A

United States Patent [19]

Huang et al.

[11] Patent Number: 5,636,231

[45] Date of Patent: Jun. 3, 1997

[54] METHOD AND APPARATUS FOR MINIMAL REDUNDANCY ERROR DETECTION AND CORRECTION OF VOICE SPECTRUM PARAMETERS

[75] Inventors: Jian-Cheng Huang, Lake Worth; Xiaojun Li, Boynton Beach; Floyd Simpson, Lantana, all of Fla.

[73] Assignee: Motorola, Inc., Schaumburg, Ill.

[21] Appl. No.: 523,578

[22] Filed: Sep. 5, 1995

[51] Int. Cl.$^6$ .................... H03M 13/00

[52] U.S. Cl. .................... 371/37.1; 375/240; 395/2.29

[58] Field of Search .................... 371/37.1; 381/29–46; 382/254, 266, 616; 375/34, 122; 358/133; 395/2, 2.29, 2.31, 2.3

[56] References Cited

U.S. PATENT DOCUMENTS

| | | | |
|---|---|---|---|
| 4,873,520 | 10/1989 | Fisch et al. . | |
| 4,885,577 | 12/1989 | Nelson . | |
| 4,922,508 | 5/1990 | Moriya | 375/34 |
| 4,965,569 | 10/1990 | Bennett et al. . | |
| 5,384,891 | 1/1995 | Asakawa et al. | 395/2.29 |
| 5,481,627 | 1/1996 | Kim | 382/254 |
| 5,511,136 | 4/1996 | Kim | 382/275 |

*Primary Examiner*—Paul P. Gordon
*Assistant Examiner*—Thomas E. Brown
*Attorney, Agent, or Firm*—D. Andrew Floam

[57] ABSTRACT

Error detection and correction of a received message, such as a digitized voice message is achieved by generating (318) interpolated vectors for each error vector corresponding to a codebook index in a sequence of codebook indexes representing parameters of portions of the message. A plurality of error corrected candidate vectors for the vector corresponding to the codebook index in error, are generated (322,324, 326) by flipping one bit in a sequence of bits representing the codebook index in error. The error corrected candidate vector which has a minimal difference from its corresponding interpolated vector is used (338) to replace the error vector. In the case of digital voice, the vectors are spectral vectors which represent spectral information for a time sample of a voice message. An ordering property of vector components is exploited to detect errors in a received codebook index without parity bits.

22 Claims, 6 Drawing Sheets

METHOD AND APPARATUS FOR MINIMAL REDUNDANCY ERROR DETECTION AND CORRECTION OF VOICE SPECTRUM PARAMETERS

FIELD OF THE INVENTION

The present invention is directed to a method for detecting and correcting errors in a received digital signal, such as a digital voice message or digital data.

BACKGROUND OF THE INVENTION

Methods for error detection and correction of digital signals, such as digital voice or digital data, vary with specific applications. For digital voice signals transmitted at a very low bit rate, forward error correction is frequently used to protect the bits. Forward error correction involves adding redundant bits to the digital signal, which affects the effective channel rate, which in turn can reduce the effective capacity of the system.

It is desirable to provide a minimal redundancy method for effectively detecting and correcting errors in a received digital signal.

DETAILED DESCRIPTION OF THE DRAWINGS

Figure 1:
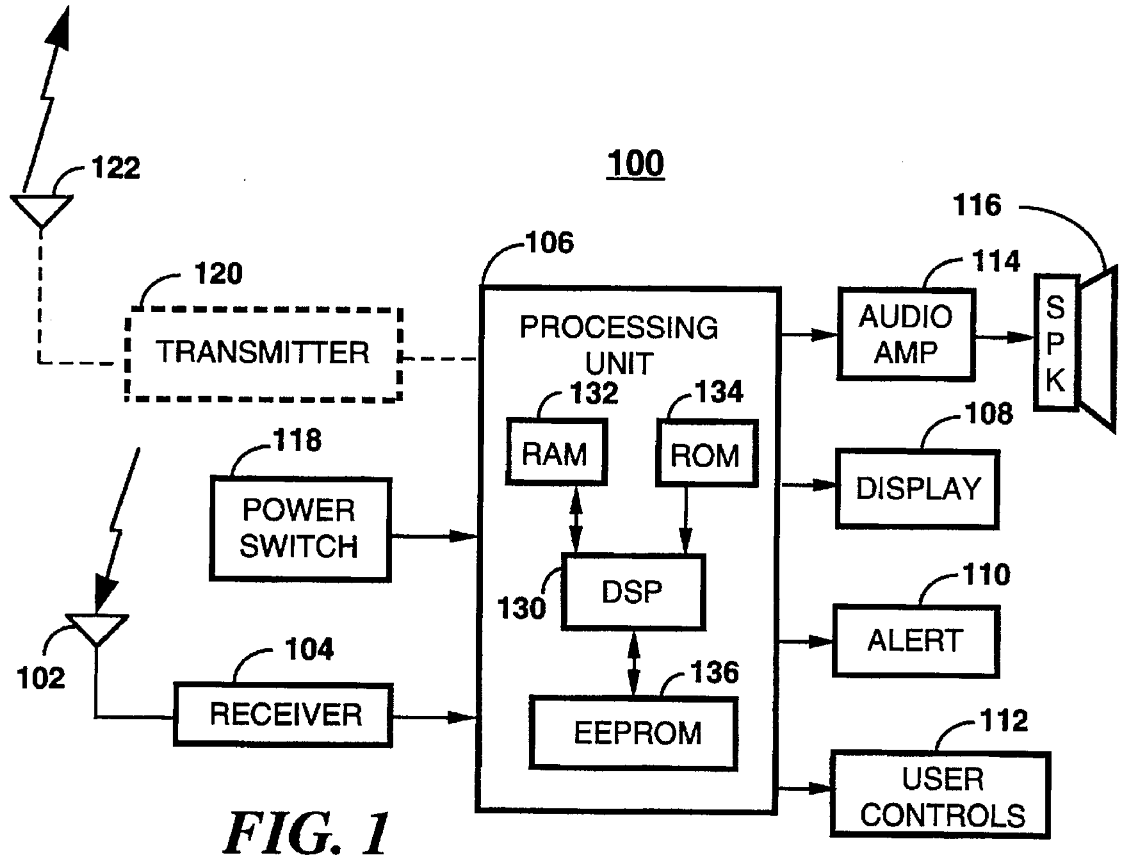
FIG. 1 is an electrical block diagram of a selective call receiver in accordance with the present invention.

Referring first to FIG. 1, a selective call receiver 100 is shown which comprises a receiving antenna 102, a receiver circuit 104, a processing unit 106, a display 108, an alert 110, user controls 112, an audio amplifier 114, an audio speaker 116, and a power switch 118. Optionally, the selective call receiver further comprises a transmitter 120 and a transmitting antenna 122.

The processing unit 106 comprises a digital signal processor (DSP) 130, a random access memory (RAM) 132, a read only memory (ROM) 134 and an electronically erasable read only memory (EEPROM) 136.

The receiver circuit 104 is connected to the receiving antenna 102 and demodulates a received signal. The processing unit 106 interprets the received signal to decode digital information contained in the received signal. Specifically, the DSP 130 is programmed by firmware stored in ROM 134 and/or software stored in RAM 132 to enable the DSP 130 to process digital information in the received signal. The RAM 132 is also used by the DSP 130 to temporarily store information derived from the received signal, such as messages.

Among other types of information, at least one selective call address code is stored in the EEPROM 136 of the processing unit. The stored selective call address code is used to correlate with an address code in the received signal, to inform the selective call receiver 100 whether further reception of the signal is required in order for the selective call receiver 100 to receive an addressed message. The processing unit 106 triggers generation of an alert by alert 110 and also display of a displayable message on the display 108. A user manipulates received messages, and performs other functionalities, through user controls 112. When the message is a digital voice message, the processing unit 106 converts the digital voice message to an analog signal which is coupled to the audio amplifier 114 and ultimately to the audio speaker 116. The DSP 130 also is capable of shutting down the receiver circuit 104 via the power switch 118 when the received signal does not contain information addressed for the selective call receiver 100, or is otherwise unrecognizable by the DSP 130. Thus, the power switch 118 is useful to save battery life in the selective call receiver 100.

FIG. 1 illustrates an example of the type of communication receiver to which the present invention pertains. The present invention has utility in communication devices in general which are capable of receiving a digital signal.

Figure 2:
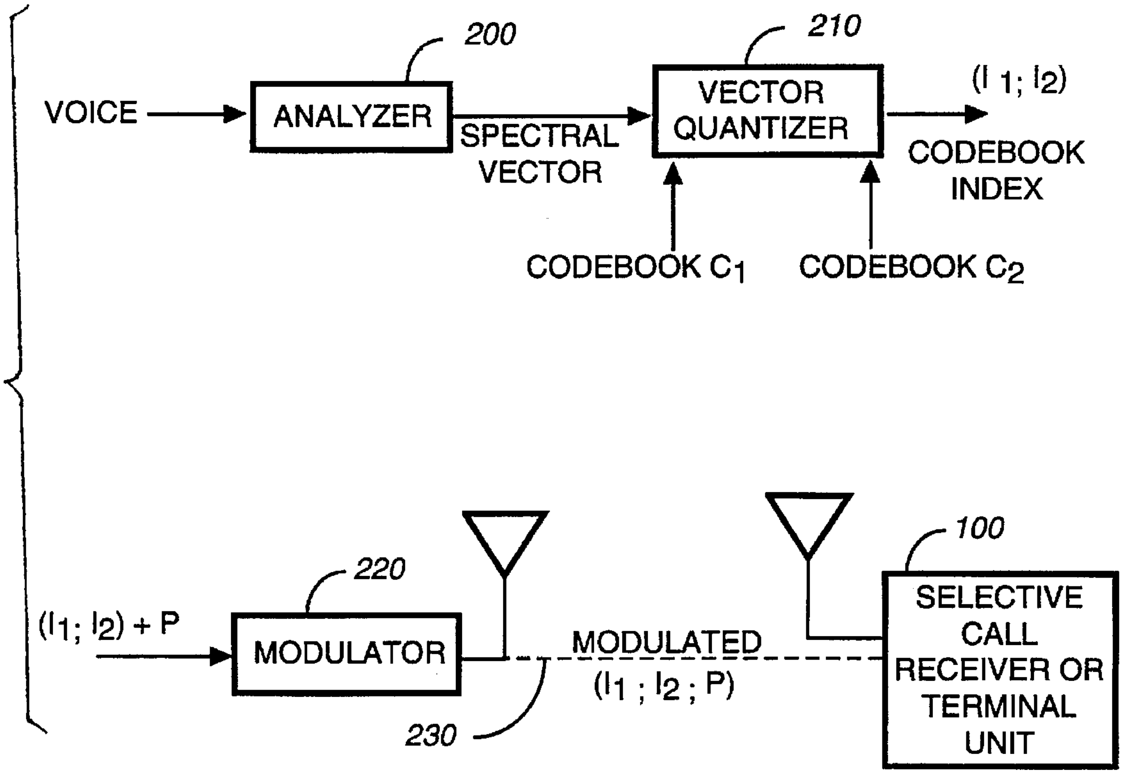
FIG. 2 is an electrical block diagram of a message encoder and transmitter according to the present invention.
Figure 3:
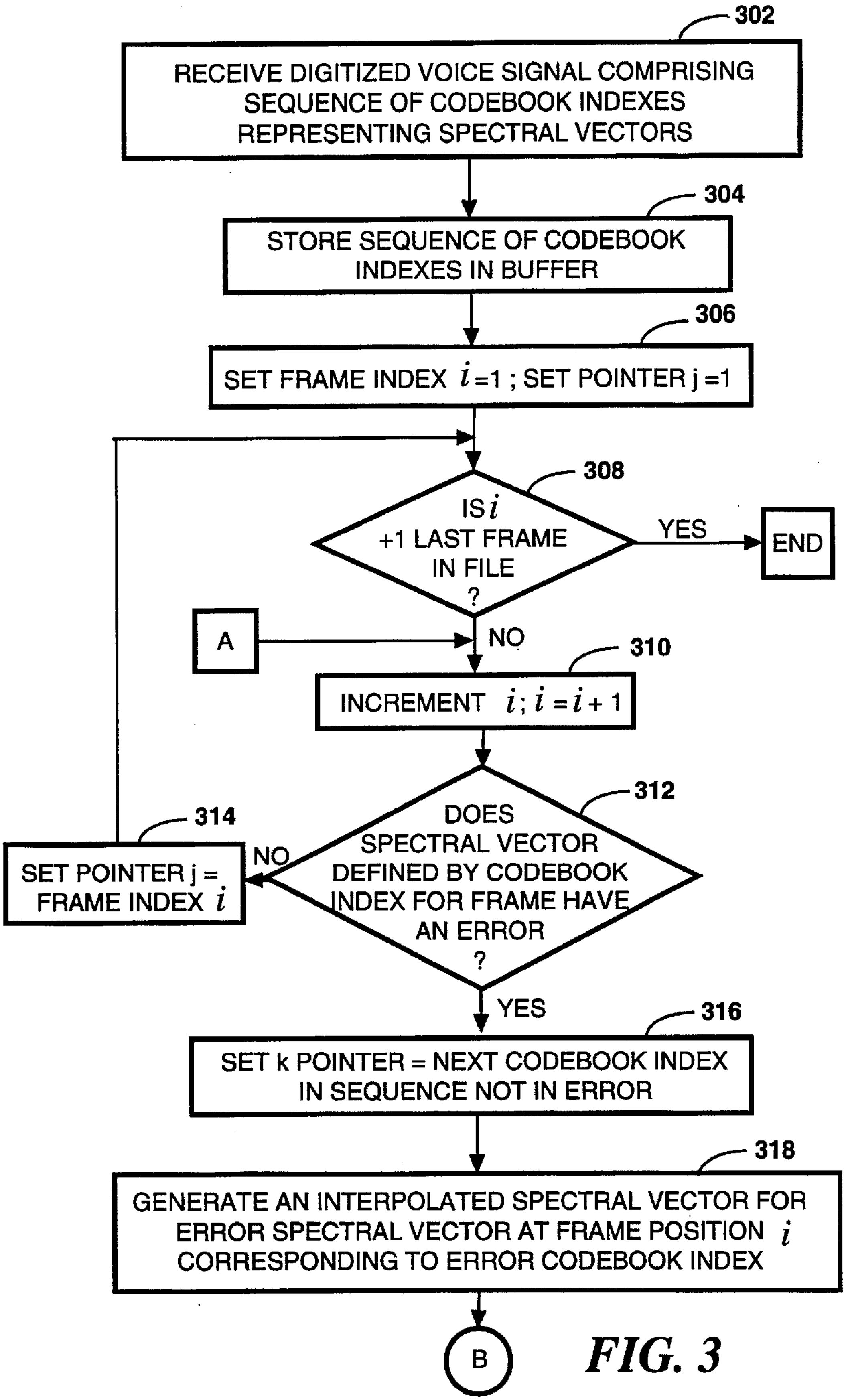
FIGS. 3–5 collectively show a flow chart depicting the error detecting and correcting method in accordance with the present invention.
Figure 4:
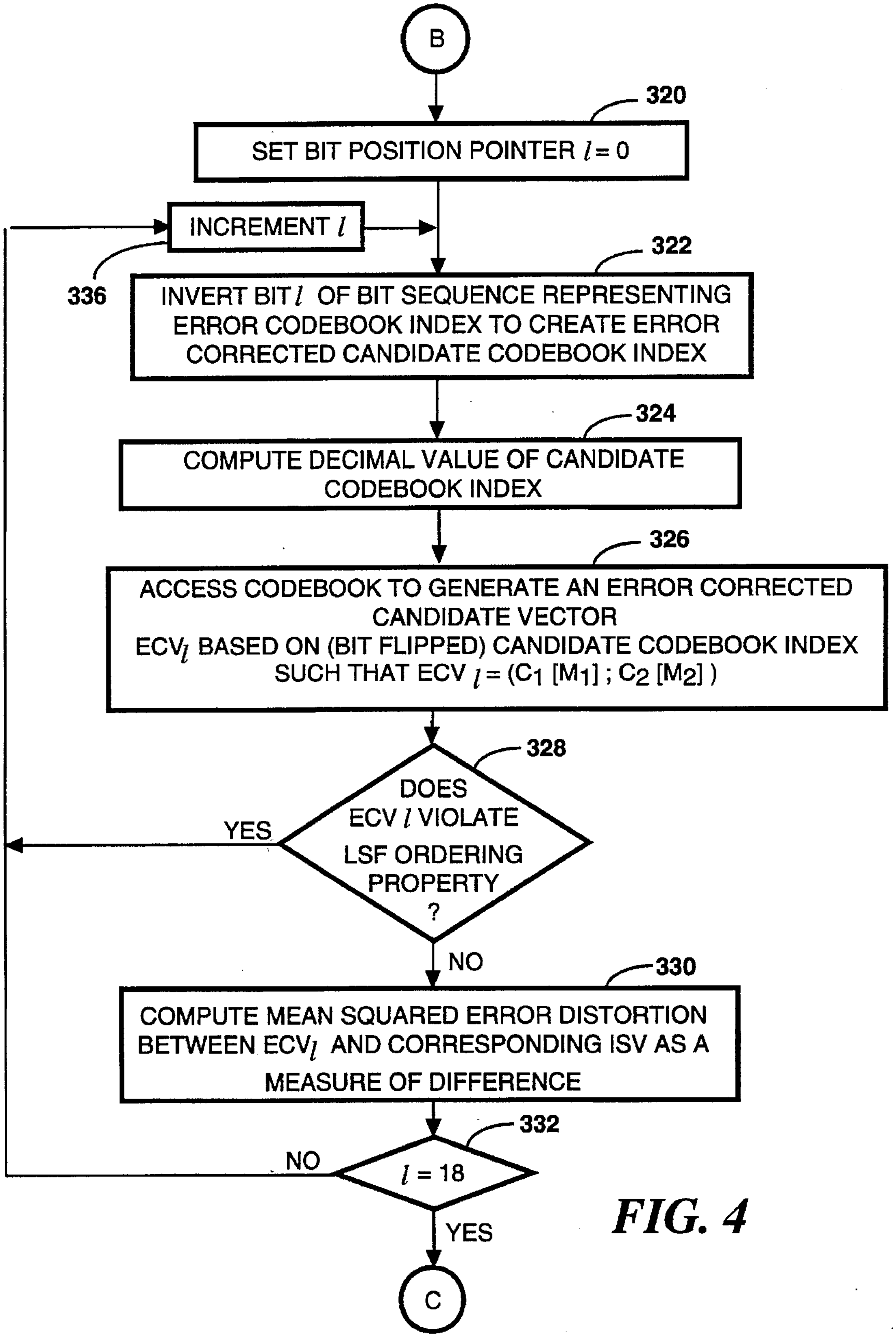
Figure 5:
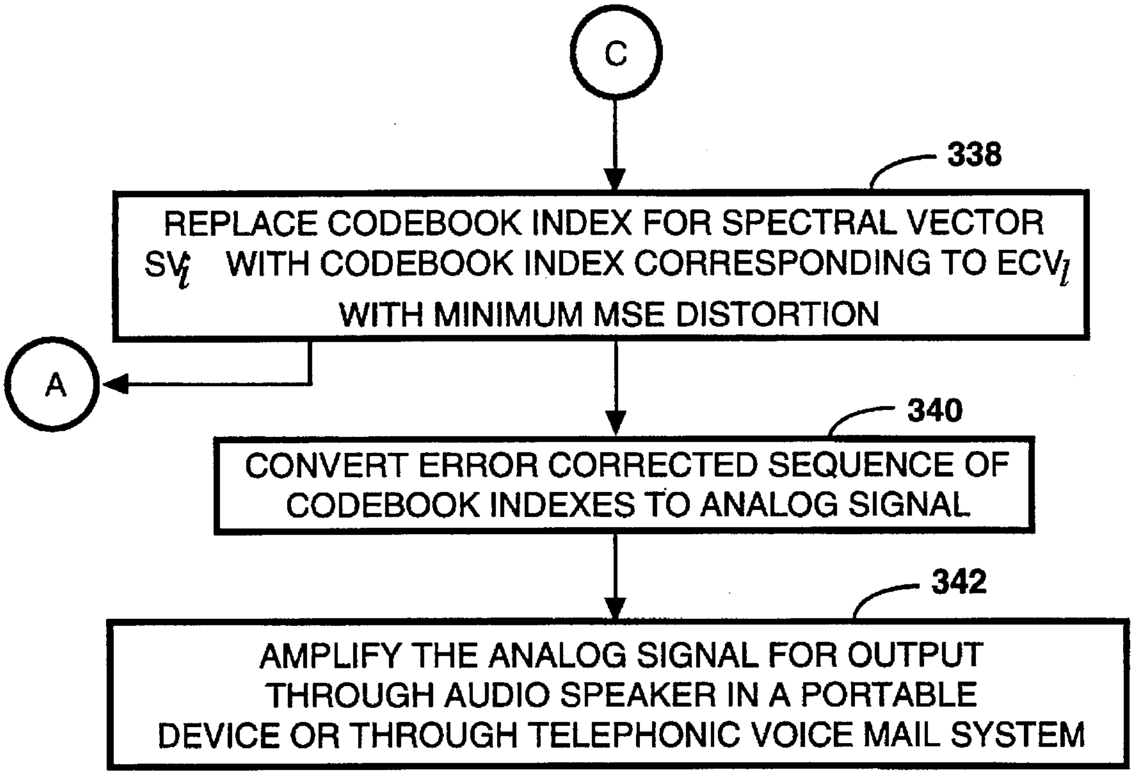

FIG. 2 illustrates a message encoder and transmitter for sampling a voice message and digitally encoding it for transmission. Briefly, the voice message is sampled and analyzed by analyzer 200. The analyzer 200 generates a spectral vector (SV), among other parameters, for each consecutive sampled time frame of the voice message. The spectral vector is processed by a vector quantizer 210 which generates a codebook index to represent a spectral vector in terms of a codebook for each time frame of the voice message. In a preferred embodiment, the vector quantizer 210 uses two spectral vector quantization codebooks, C1 and C2, to split-quantize the spectral vector. Alternatively, only one codebook is used to quantize and encode the spectral vector, or more than two codebooks are used to quantize the spectral vector. The technique of encoding a time frame or short time segment of a voice message to generate a spectral vector using one codebook, or two codebooks for split vector quantization, is known in the art.

When two codebooks are used, the codebook C1 contains, for example, a first portion of line spectral frequency (LSF) components and the codebook C2 contains a second portion of the LSF components. In the example used herein, the first codebook C1 is a 9-bit codebook containing the components for the first 4 of 10 LSF components and the second codebook C2 is a 9 bit codebook containing the remaining 6 LSF components. A first codebook subindex I1 is defined in terms of codebook C1 and a second codebook subindex I2 is defined in terms of C2. A codebook index (CBI) consists of codebook subindexes I1 and I2 concatenated together to represent a 10 dimensional SV in terms of the first and second spectral vector quantization codebooks C1 and C2. The SV is denoted {C1[I1], C2[I2]} where C1[I1] =(x1, x2, x3, x4) and C2[I2]=(x5, x6, x7, x8, x9, x10), where x1–x4 are the first 4 LSF components and x5–x10 are the last 6 LSF components.

As described above, for each codebook subindex I1 and I2, 9 bits are used for representation. As a result, the codebook index comprising codebook subindexes I1 and I2 is denoted (I1,I2), and is represented by 18 bits {b1,b2, . . . ,b9;b10,b11, . . . ,b18}, where I1 ={b1, . . . , b9} and I2 ={b10–b18}.

Prior to modulation of the codebook index, at least one parity bit P (an even parity bit) is optionally generated for each codebook index and associated therewith. As will become apparent hereinafter, the at least one parity bit P is not necessary to enable detection and correction of errors, but is useful. Specifically, when two or more codebooks which have an interframe correlation of the line spectral frequency components of the voice message are used to encode the message, it is possible to detect error codebook indexes in the received signal without using parity by comparing the values of components of the spectral vector corresponding to the received codebook subindexes. This correlation is called an LSF ordering property and is exhibited in the example of the 10 dimensional coding format described above. Other correlations may be useful for other types of messages. Nevertheless, when parity is used, more than one parity bit may be provided, at the expense, however, of increasing redundancy in the system.

It should be understood that while FIG. 2 shows an encoding process for voice, other data messages may be encoded in a similar way to generate vectors representing samples of the message for transmission. For example, the present invention has utility in connection with other messages, such as graphics (where spatial sampling is used), alphanumeric messages, etc. For non-voice type messages, the spectral vectors may be termed "sample vectors" or simply "vectors", which represent other types of parameters of a sample or portion of a message.

The sequence of codebook indexes which represent the message are transmitted, over-the-air, or by wire 230. The present invention has utility in wireless and wireline (telephonic, cable-line, etc.) applications. The selective call receiver 100 is of the type shown in FIG. 1, but as indicated in FIG. 2, the message may be received and processed by a terminal unit as part of a larger messaging system, such as a voice mail system in a telephone network. In any event, the transmitted digitized voice signal is received for processing and error correction.

Turning now to FIGS. 3–6, the process by which the digitized message is recovered is described. This process is preferably embodied by firmware stored in the processing unit 106. Briefly, the process is a two-stage procedure comprising an error detection phase and a non-algebraic error correction phase. FIGS. 3–6 use the example of detecting and correcting errors in a received digitized voice signal for purposes of explaining the present invention. At least one spectral vector quantization codebook is stored in the selective call receiver 100 or at the site where the transmitted digitized voice signal is received and processed. In the specific example where two codebooks C1 and C2 are used, each of these codebooks is stored in the selective call receiver 100 or otherwise made available at the reception site. The codebook(s) stored in the receiver match the codebook(s) used at the encoding side.

Figure 6:
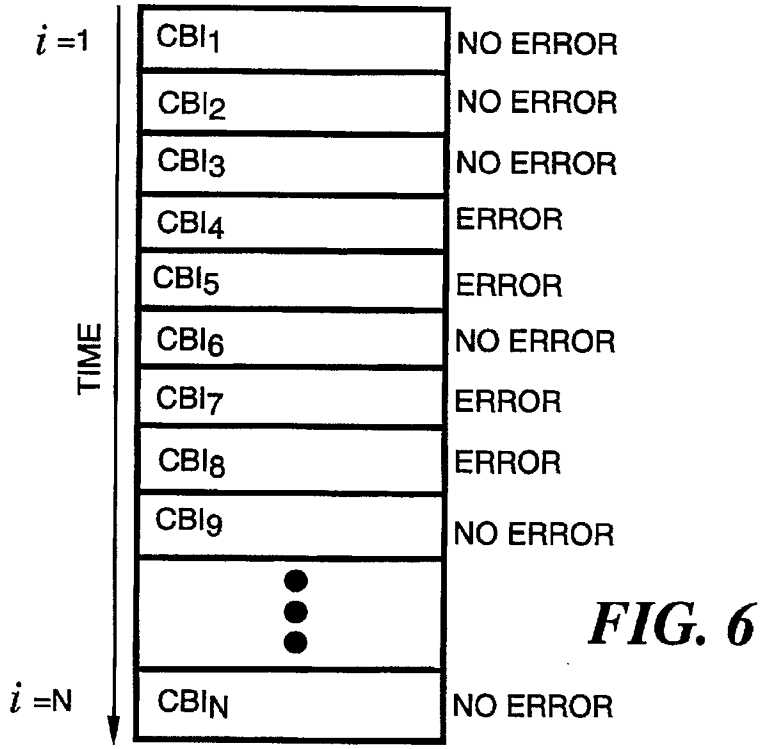
FIG. 6 is a diagram illustrating storage in a buffer memory of a sequence of codebook indexes in a received digital signal, according to the present invention.

In step 302, the digitized voice signal is received. The digitized voice signal comprises a sequence of codebook indexes defining spectral vectors which represent spectral information of time frames of a voice message. In step 304, the sequence of codebook indexes representing the message is stored in a buffer, such as the RAM 132 of selective call receiver 100. FIG. 6 illustrates storage of the codebook indexes, with or without parity bit(s) in a buffer memory, such as RAM 132 shown in FIG. 1. An example is shown in which, within a sequence of codebook indexes numbered $CBI_1$ to $CBI_N$, codebook indexes for the spectral vectors SV4, SV5, SV7 and SV8 have errors. Which codebook indexes, and thus which corresponding spectral vectors, have errors is not known until each codebook index is examined.

To this end, in step 306, the frame index i is set equal to 1 and the pointer j is set equal to 1. Next, in step 308, the frame index i is temporarily incremented by 1 to determine if the next frame is the last in the sequence or file. If it is, then the procedure ends. Otherwise, the procedure continues to step 319 where the frame index i is incremented by 1 (thus skipping over the first codebook index). In step 312, the codebook index for spectral vector SV(i+1) is examined to determine whether it has an error.

The process of examining a codebook index and its corresponding spectral vector to determine whether it has an error is performed in one of two ways. First, in the case where at least one parity bit P is transmitted with each codebook index, then the parity bit P is examined. Second, with or without a parity bit P, if at least two codebooks are used to encode the spectral vectors, so that a property such as the LSF ordering property exists between codebook subindexes of the vector (subindexes I1 and I2, for example), then the spectral vector corresponding to each codebook subindex I1 and I2 is examined. If there is a violation of the LSF ordering property between components of the spectral vector defined by codebook subindexes I1 and I2, then the combination of the codebook subindexes and the corresponding spectral vector is said to violate the ordering property and to therefore be in error.

Set forth below is an example of the codebooks C1 and C2, with spectral vector component entries listed only for those codebook subindexes involved in the following example:

| | C1 | | | |
|---|---|---|---|---|
| | x1 | x2 | x3 | x4 |
| 0 | | | | |
| 1 | | | | |
| 2 | .0638 | .0765 | .1326 | .1440 |
| 3 | | | | |
| 4 | .0380 | .0562 | .1196 | .1847 |
| . | | | | |
| . | | | | |
| . | | | | |
| 101 | | | | |
| . | | | | |
| . | | | | |
| . | | | | |
| 511 | | | | |

| | C2 | | | | | |
|---|---|---|---|---|---|---|
| | x5 | x6 | x7 | x8 | x9 | x10 |
| 0 | | | | | | |
| 1 | | | | | | |
| 2 | .174 | .2289 | .2708 | .3147 | .3729 | .4060 |
| 3 | | | | | | |
| 4 | | | | | | |
| . | | | | | | |
| . | | | | | | |
| . | | | | | | |
| 101 | .2252 | .2734 | .3141 | .3479 | .3941 | .4217 |
| . | | | | | | |
| . | | | | | | |
| . | | | | | | |
| 511 | | | | | | |

Recalling that each codebook subindex I1 and I2 is represented by a 9 bit sequence of bits, there are 512 possible combinations of codebook entries. The codebook entries are the spectral vector components x1–x4 and x5–x10. As an example, the codebook subindexes (I1;I2) which are transmitted are (4;101). Suppose I1 is received without error but the value of 12 that is received, denoted I2'=2. The decoded value of the spectral vector {x1–x10} corresponding to the codebook subindexes (4;2) is:

{0.0380, 0.0562, 0.1196, 0.1847, 0.1721, 0.2289, 0.2708, 0.3147, 0.3729, 0.4060 }

The spectral vector components x4–x6 which are underlined violate a line spectral frequency ordering property. This property states that the value of spectral vector component x(n) is less than or equal to the value of spectral vector component x(n+1). Thus, because the value of x4 is 0.1847, which is greater than the value of x5, which is 0.1721, the spectral vector corresponding to the codebook subindexes (4;2) is not a valid spectral vector, and thus the codebook index (4;2) is in error. Thus, by examining the individual spectral vector components, particularly x4 and x5, of a spectral vector defined by a combination of the subindexes I1 and I2, it is possible to determine that the received codebook index comprised of subindexes I1 and I2 is in error.

With at least two codebooks with such a property or relationship, it is possible to detect an error without adding a parity bit to the data. An encoding scheme comprising more than two codebooks having an ordering property would have similar advantages.

Returning to FIG. 3, when the spectral vector SV(i+1) defined by codebook index for frame (i+1) is determined in step 312 not to be in error, then in step 314 the pointer j is set equal to the frame index i, and steps 308–312 are repeated for the next frame in the sequence. When the codebook index for spectral vector SV(i+1) is determined in step 312 to be in error, then in step 316, the pointer k is set to the value of the next codebook index in the sequence which does not have an error. Thus, occurring during step 316 is further examination of codebook indexes and corresponding spectral vectors in the sequence immediately subsequent the codebook index determined to have an error. Referring to the example shown in FIG. 6, when the codebook index for spectral vector SV4 is reached, it will be determined that it has an error and then the next codebook index for spectral vector SV5 is examined which will also have an error. The next codebook index for spectral vector SV6 is examined and it will be determined not to have an error. Thus, in step 316, the pointer k is set to 6 for SV6, the first non-error codebook index immediately following the error codebook index for spectral vector SV4. In the example of FIG. 6, coincidentally, SV5 is also in error. In essence, spectral vector SVj is the spectral vector which immediately precedes a spectral vector which has an error and spectral vector SVk is the spectral vector which immediately follows the spectral vector which has an error.

In step 318, for those codebook indexes which have errors between the non-error codebook indexes (corresponding to spectral vectors SVj and SVk), interpolated spectral vectors are generated. In the example of FIG. 6, interpolated spectral vectors are generated for spectral vectors SV4 and SV5, using SV3 and SV6 as references, and for spectral vectors SV7 and SV8 using spectral vectors SV6 and SV9. It should be noted that spectral vectors which are determined to have an error and are subsequently corrected, are used for correcting other spectral vectors in the sequence by the interpolation process described below. That is, an interpolated spectral vector for SV5 is generated on the basis of SV6 and the newly generated error corrected spectral vector for SV4.

Figure 7:
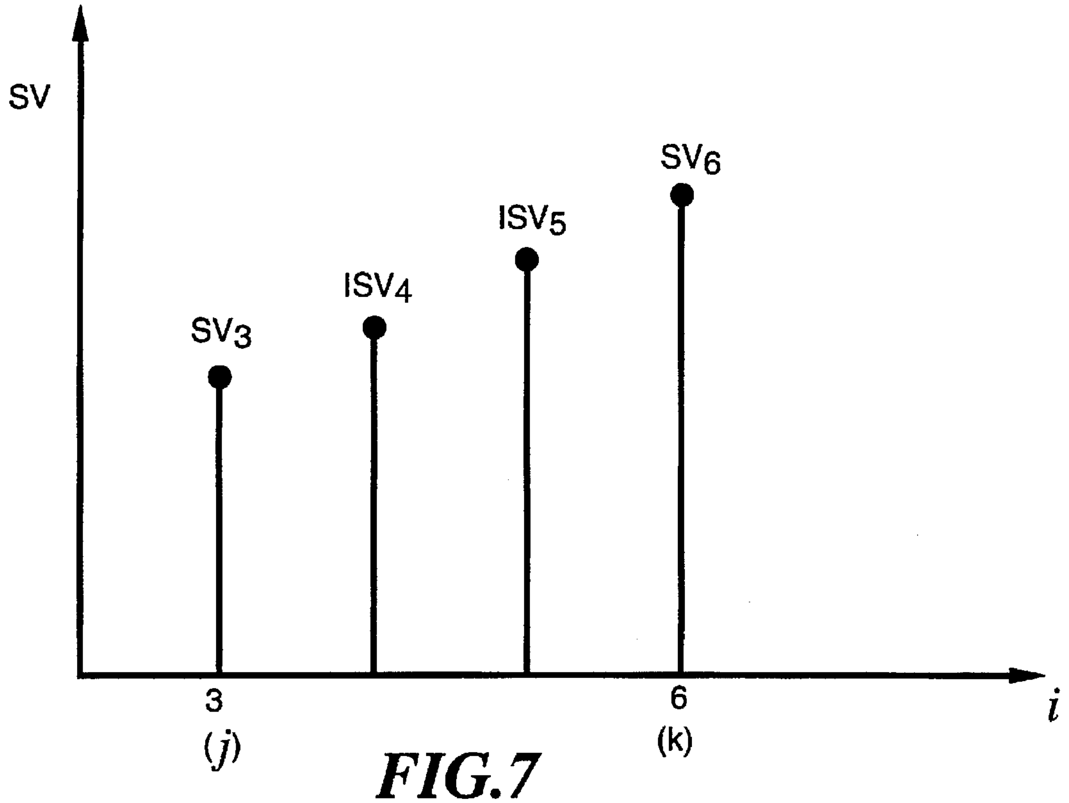
FIG. 7 is a graphical diagram illustrating a linear interpolation procedure to generate interpolated spectral vectors for error spectral vectors, according to the present invention.

FIG. 7 illustrates one way to generate interpolated spectral vectors for error spectral vectors SV4 and SV5. The method illustrated is linear interpolation which is known in the art and therefore not explained in detail herein. Other methods, such as non-linear interpolation are also useful. Furthermore, in some instances, it is not necessary to locate the boundary non-error spectral vectors; rather interpolation is made for an error spectral vector on the basis of at least one non-error spectral vector in the sequence. Linear interpolation has been found to be useful in the case of digital voice messages, but for other data types, other interpolation methods may prove more useful.

The interpolated spectral vectors for error spectral vectors SV4 and SV5 are denoted ISV4 and ISV5. Similarly, interpolated spectral vectors for error spectral vectors SV7 and SV8 are generated and denoted ISV7 and ISV8.

Next, in step 320, a bit position pointer 1 is set to 0, where 1 represents one of the bits in the bit sequence {(Ib1, . . . , Ib9); (Ib10, . . . , Ib18)} of the codebook index determined to be in error. In step 322, a candidate sequence for each codebook index determined to have an error is generated by inverting a first bit in the bit sequence {(Ib1, . . . , Ib9); (Ib10, . . . , Ib18)}. The candidate sequence is referred to as an error corrected candidate codebook index. Next, in step 324, decimal values of the error corrected candidate codebook index is generated such that M1=decimal value of (Ib1, . . . , Ib9) and M2=(Ib10, . . . , Ib18) where one bit in the sequence of bits Ib1–Ib18 representing the codebook index determined to be in error, beginning with Ib1, is inverted or flipped. Thus, a bit in either codebook subindex I1 or codebook subindex I2 is flipped. An error corrected candidate vector $ECV_1$ is generated based on the error corrected candidate codebook index and the first and second codebooks C1 and C2 such that $ECV_1$={(C1[M1]; C2[M2]}.

Next in step 328, it is determined whether $ECV_1$ violates the LSF ordering property. This step is optional when two or more codebooks are used, but when used, eliminates from consideration those error corrected candidate vectors which are not valid because of violation of the ordering property described above. Error corrected candidate vectors which violate the ordering property are disqualified in step 328. This step is not performed when a single codebook is used, or certain multiple codebooks are used for which no ordering property exists.

When the error corrected candidate vector $ECV_1$ does not violate an ordering property, in step 330, the error corrected candidate vector $ECV_1$ is compared with its corresponding ISV. One way this comparison is made is by computing a mean squared error distortion between the $ECV_1$ and the ISV corresponding to the codebook index determined to have an error. Mean squared error distortion is one example of a measure of difference between an error corrected candidate vector and its corresponding interpolated spectral vector. Other measures of difference between $ECV_1$ and its ISV are also useful.

In step 332, it is determined whether the bit index 1 has reached its maximum value, which is 18 in the example where the spectral vector is represented by 18 bits. Until the bit index 1 reaches its maximum value, it is incremented in step 336 and steps 322–330 are repeated. Thus, each bit in the sequence of bits that represent the codebook index determined to have an error is inverted or flipped, one-at-a-time, to generate a plurality of error corrected candidate codebook indexes each having one bit differing from the sequence of bits which represents the codebook index determined to have an error. For each error corrected candidate codebook index, an error corrected candidate spectral vector is generated based on the codebooks C1 and C2.

Then, in step 338, the error corrected candidate spectral vector $ECV_1$ with the least measure of difference from its corresponding interpolated spectral vector ISVi is used to replace the codebook index and corresponding spectral vector SVi determined to have an error. Thus, the codebook index corresponding to the error corrected candidate spectral vector $ECV_1$ replaces the codebook index determined to have an error. As a result, a new error corrected spectral vector defined by the best match candidate codebook index replaces the spectral vector corresponding to the codebook index determined to be in error. The sub-procedure of steps 310–338 repeats for each error codebook index.

Figure 8:
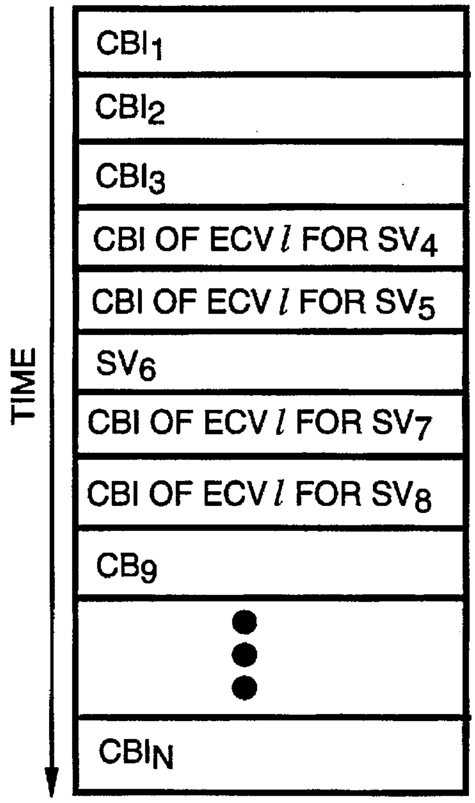
FIG. 8 is a diagram illustrating a sequence of error corrected codebook indexes generated in accordance with the present invention.

As shown in FIG. 8, the CBI's of the $ECV_1$'s for SV4, SV5, SV7 and SV8, respectively, which have a minimal difference when compared respectively with interpolated spectral vectors ISV4, ISV5, ISV7 and ISV8, replace the CBI's for spectral vectors SV4, SV5, SV7 and SV8. FIG. 8 illustrates an error corrected sequence of codebook indexes, which represents an error corrected sequence of spectral vectors. In step 340, the error corrected sequence of codebook indexes (corresponding error corrected sequence of spectral vectors) is converted to an analog signal. In the case of a voice message, this analog signal is then amplified to be heard by a user through an audio speaker 116 in the selective call receiver 100 or through a telephone voice mail system, for example. Alternatively, the error corrected sequence of codebook indexes is stored for later conversion and user output.

In summary, the present invention enables the transmission of a digital message, and error detection and correction thereof upon reception with minimal error redundancy. Parity bits are not required in order to detect and correct an error in a codebook index which references multiple codebooks having an ordering property. However, even when a codebook (or multiple codebooks) is used which does not have an ordering property, only a minimal number of parity bit or bits is needed.

What is claimed is:

1. A method for detecting and correcting errors in a received digitized voice signal comprising steps of:

(a) storing at least one spectral vector quantization codebook comprising a plurality of spectral vectors and corresponding codebook indexes, the spectral vectors representing spectral information of voice;

(b) receiving a digitized voice signal comprising a sequence of codebook indexes defining corresponding spectral vectors in terms of the at least one spectral vector quantization codebook, each spectral vector representing spectral information of a time frame of a voice message, each codebook index comprising a sequence of bits;

(c) storing the sequence of codebook indexes;

(d) examining the sequence of codebook indexes to determine which codebook indexes and corresponding spectral vectors have an error, and for each codebook index and corresponding spectral vector determined to have an error:

(e) detecting at least one non-error codebook index in the sequence of codebook indexes;

(f) generating an interpolated spectral vector for the spectral vector corresponding to the codebook index determined to have an error based on a spectral vector corresponding to the at least one non-error codebook index;

(g) generating a plurality of error corrected candidate vectors based on the at least one spectral vector quantization codebook for each codebook index and corresponding spectral vector determined to have an error;

(h) comparing each interpolated spectral vector with each of the plurality of error corrected candidate vectors for the corresponding codebook index determined to have an error to determine a measure of difference there between; and (i) replacing each codebook index determined to have an error with a codebook index corresponding to an error corrected candidate vector which has a least measure of difference when compared with a corresponding interpolated spectral vector to generate an error corrected sequence of codebook indexes.

2. The method of claim 1, wherein the step (d) of examining comprises detecting an error in at least one parity bit associated with each codebook index in the digitized voice signal.

3. The method of claim 1, wherein the step (a) of storing comprises storing at least first and second spectral vector quantization codebooks, wherein each codebook index comprises first and second codebook subindexes, the first codebook subindex being with respect to the first spectral vector quantization codebook and the second codebook subindex being with respect to the second spectral vector quantization codebook.

4. The method of claim 3, wherein the step (d) of examining comprises detecting a violation of an ordering property of line spectral frequency components of a spectral vector corresponding to the first and second codebook subindexes.

5. The method of claim 4, wherein the step (f) of generating an interpolated spectral vector comprises interpolating, between a spectral vector corresponding to a non-error codebook index which immediately precedes the codebook index which is determined to have an error, and a spectral vector corresponding to a non-error codebook index immediately following the codebook index which is determined to have an error.

6. The method of claim 5, wherein the step (g) of generating a plurality of error corrected candidate vectors comprises:

(g(1)) inverting one bit in the sequence of bits which represents the codebook index determined to have an error to generate a plurality of error corrected candidate codebook indexes, each error corrected candidate codebook index having one bit differing from the sequence of bits which represents the codebook index determined to have an error; and (g(2)) generating an error corrected candidate vector for each error corrected candidate codebook index based on the first and second spectral vector quantization codebooks.

7. The method of claim 6, and further comprising the step of disqualifying an error corrected candidate vector when it violates an ordering property of line spectral frequency components.

8. The method of claim 7, wherein the step (h) of comparing comprises determining a mean squared error between each interpolated spectral vector and each of the plurality of error corrected candidate vectors which does not violate the ordering property of line spectral frequency components, to determine a measure of difference there between.

9. The method of claim 1, wherein the step (f) of generating an interpolated spectral vector comprises interpolating, between a spectral vector corresponding to a non-error codebook index which immediately precedes the codebook index which is determined to have an error, and a non-error spectral vector corresponding to a codebook index immediately following the codebook index which is determined to have an error.

10. The method of claim 9, wherein the step (g) of generating a plurality of error corrected candidate vectors comprises:

(g(1)) inverting one bit in the sequence of bits which represents the codebook index determined to have an error to generate a plurality of error corrected candidate codebook indexes, each error corrected candidate codebook index having one bit differing from the sequence of bits which represents the codebook index determined to have an error; and (g(2)) generating an error corrected candidate vector for each error corrected candidate codebook index based on the at least one spectral vector quantization codebook.

11. The method of claim 10, wherein the step (h) comprises determining a mean squared error between each interpolated spectral vector and each of the plurality of error corrected candidate vectors.

12. The method of claim 1, and further comprising a step (j) of converting the error corrected sequence of codebook indexes to an analog signal representing a voice message.

13. A communication device for receiving and correcting errors in a transmitted signal which includes a digitized voice signal, the digitized voice signal comprising a sequence of codebook indexes defining corresponding spectral vectors in terms of the at least one spectral vector quantization codebook, each spectral vector representing spectral information of a time frame of a voice message, each codebook index comprising a sequence of bits, the communication device comprising:

a receiver circuit for receiving the transmitted signal including the digitized voice signal;

a memory coupled to the receiver circuit for storing the sequence of codebook indexes of the digitized voice signal and for storing at least one spectral vector quantization codebook;

a processing unit coupled to the receiver circuit and the memory, the processing unit being programmed for:

(a) examining the sequence of codebook indexes in the memory to determine which codebook indexes and corresponding spectral vectors have an error, and for each codebook index and corresponding spectral vector determined to have an error:

(b) detecting at least one non-error codebook index in the sequence;

(c) generating an interpolated spectral vector for the spectral vector corresponding to the codebook index determined to have an error based on a spectral vector corresponding to the at least one non-error codebook index;

(d) generating a plurality of error corrected candidate vectors based on the at least one spectral vector quantization codebooks for the codebook index determined to have an error;

(e) comparing each interpolated spectral vector with each of the plurality of error corrected candidate vectors for the corresponding spectral vector determined to have an error to determine a measure of difference there between;

(f) replacing each codebook index determined to have an error with a codebook index corresponding to an error corrected candidate vector which has a least measure of difference when compared with a corresponding interpolated spectral vector to generate an error corrected sequence of codebook indexes;

(h) converting the error corrected sequence of codebook indexes to an analog signal representing the voice message;

an audio amplifier coupled to the processing unit for amplifying the analog signal to generate an amplified analog signal; and a speaker coupled to the audio amplifier and responsive to the amplified analog signal for emitting as sound the voice message.

14. The communication device of claim 13, wherein the communication device is a selective call receiver and wherein the processing unit is programmed to compare an address code in a signal received by the receiver circuit with a stored selective call address code, and the processing unit enabling the receiver circuit to receive the transmitted signal including the digitized voice signal representing the voice message only when the address code in the signal received by the receiver circuit correlates with the stored selective call address code.

15. The communication device of claim 13, wherein the processing unit is further programmed for determining in step (a) whether a codebook index has an error by detecting an error in at least one parity bit associated with each codebook index.

16. The communication device of claim 13, wherein the memory stores at least first and second spectral vector quantization codebooks, and wherein each codebook index comprises first and second codebook subindexes, the first codebook subindex being with respect to the first spectral vector quantization codebook and the second codebook subindex being with respect to the second spectral vector quantization codebook.

17. The communication device of claim 16, wherein the processing unit is further programmed in step (a) for examining a codebook index by detecting a violation of an ordering property of line spectral frequency components of the spectral vector corresponding to the first and second codebook subindexes.

18. The communication device of claim 13, wherein the processing unit is further programmed in step (c) for generating an interpolated spectral vector by interpolating, between a spectral vector corresponding to a non-error codebook index which immediately precedes the codebook index determined to have an error, and a spectral vector corresponding to a non-error spectral vector which immediately follows the codebook index determined to have an error.

19. The communication device of claim 18, wherein the processing unit is further programmed for generating in step (d) a plurality of error corrected candidate vectors by:

(d(1)) inverting one bit in the sequence of bits which represents the codebook index determined to have an error to generate a plurality of error corrected candidate codebook indexes, each error corrected candidate codebook index having one bit differing from the sequence of bits which represents the codebook index determined to have an error; and (d(2)) generating an error corrected candidate vector for each error corrected candidate codebook index based on the at least one spectral vector quantization codebook.

20. The communication device of claim 19, wherein the processing unit is further programmed in said step (e) of comparing for determining a mean squared error between each interpolated spectral vector and each of the plurality of error corrected candidate vectors.

21. A method for communicating a message with minimal error redundancy comprising steps of:

(a) generating a signal for transmission to a communication receiver, the signal including a digital signal comprising a sequence of codebook indexes which define vectors in terms of components of at least one codebook, each vector representing information about a portion of the message;

(b) transmitting the signal to a communication receiver;

(c) storing the at least one codebook in a communication receiver;

(d) receiving the signal at the communication receiver;

(e) storing the sequence of codebook indexes which are included in the signal that is received by the communication receiver;

(f) examining the codebook indexes in the sequence and determining which codebook indexes have errors;

(g) generating an interpolated vector corresponding to each codebook index determined to have an error based on a vector corresponding to a non-error codebook index in the sequence;

(h) generating a plurality of error corrected candidate vectors based on the at least one codebook for each codebook index determined to have an error;

(i) comparing each interpolated vector with the plurality of error corrected candidate vectors to determine a measure of difference there between; and (j) replacing each codebook index in the sequence determined to have an error with a codebook index corresponding to an error corrected candidate vector which has a least measure of difference when compared with the interpolated vector to generate an error corrected sequence of codebook indexes.

22. The method of claim 21, wherein the step (h) comprises steps of:

(h(1)) inverting one bit in the sequence of bits which represents the codebook index determined to have an error to generate a plurality of error corrected candidate codebook indexes, each error corrected candidate codebook index having one bit differing from the sequence of bits which represents the codebook index determined to have an error; and (h(2)) generating an error corrected candidate vector for each error corrected candidate codebook index based on the at least one codebook.

* * * * *